United States Patent
Roozeboom et al.

(10) Patent No.: US 8,563,990 B2
(45) Date of Patent: Oct. 22, 2013

(54) ELECTRONIC DEVICE AND METHOD OF MANUFACTURING AN ELECTRONIC DEVICE

(75) Inventors: Freddy Roozeboom, Waalre (NL); Herbert Lifka, Son en Breugel (NL); Frederik Vanhelmont, Maaseik (BE); Wouter Dekkers, Roosendaal (NL)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 536 days.

(21) Appl. No.: 12/419,900

(22) Filed: Apr. 7, 2009

(65) Prior Publication Data
US 2009/0289265 A1    Nov. 26, 2009

(30) Foreign Application Priority Data

Apr. 7, 2008  (EP) ..................................... 08103404

(51) Int. Cl.
*H01L 33/00*    (2010.01)
(52) U.S. Cl.
USPC .............. 257/80; 257/E33.056; 257/E33.067; 257/678

(58) Field of Classification Search
USPC ...................... 257/80, 678, E33.056, E33.067
See application file for complete search history.

(56) References Cited

FOREIGN PATENT DOCUMENTS

EP        0 526 776  A1     7/1992

*Primary Examiner* — Long Pham
(74) *Attorney, Agent, or Firm* — Haynes and Boone, LLP

(57) ABSTRACT

An electronic device comprising at least one die stack having at least a first die (D1) comprising a first array of light emitting units (OLED) for emitting light, a second layer (D2) comprising a second array of via holes (VH) and a third die (D3) comprising a third array of light detecting units (PD) for detecting light from the first array of light emitting units (OELD) is provided. The second layer (D2) is arranged between the first die (D1) and the third die (D3). The first, second and third array are aligned such that light emitted from the first array of light emitting units (OLED) passed through the second array of via holes (VH) and is detected by the third array of light detecting units (PD). The first array of light emitting units and/or the third array of light detecting units are manufactured based on standard semiconductor manufacturing processes.

20 Claims, 2 Drawing Sheets ns of 5-1500 μm.

ELECTRONIC DEVICE AND METHOD OF MANUFACTURING AN ELECTRONIC DEVICE

CROSS REFERENCE

This application claims priority to European patent application number 08103404.3, filed Apr. 7, 2008, the disclosure of which is incorporated herein by reference.

FIELD OF THE INVENTION

The present invention relates to an electronic device and to a method of manufacturing an electronic device.

BACKGROUND OF THE INVENTION

Modern electronic devices like system-in-package SiP devices typically contain several dies which are stacked on top of each other. These dies can be electrically interconnected for example with through-wafer holes such as via interconnects in order to electrically connect the different electronic circuits on the dies. The holes can be filled with conductors such as doped poly-silicon, tungsten and copper. However, the conductor which is filling the via holes must have a high conductivity preferably higher than that for copper due to the skin effect which appears in ultra high frequency applications. Yet, copper is among the highest-conductivity metals and preferred in Si-technology above, e.g. silver. The deposition of copper is for example performed by electroplating which has several disadvantages such as a slow deposition rate, an inhomogeneity of the layer thickness and a non-uniformity of the filling degree. Furthermore, copper is not a favourite design choice in a microelectronic environment as the diffusion barrier layers in the via holes are insufficient such that copper can diffuse into the silicon and can cause an electrical breakdown of p-n junctions. In addition, the wafer stacking requires complicated processing since a multitude of reliable small contacts have to be realized on all dies.

EP 0 526 776 A1 discloses an optoelectric package with a free direct space optical communication between pairs of optical transmitters and receivers located on different substrate surfaces. The transmitters and receivers are aligned such that a light beam from a transmitter follows an optical path to a respective receiver. In the intervening substrates via holes are located to enable the light from the transmitters to pass there through. The transmitter and the receivers are C4-mounted on the respective substrates.

SUMMARY OF THE INVENTION

It is therefore an object of the invention to provide an electronic device with an improved optical communication capability.

This object is solved by an electronic device according to claim 1, and a method of manufacturing an electronic device according to claim 11.

Therefore, an electronic device comprising at least one die stack having at least a first die comprising a first array of light emitting units for emitting light, a second layer comprising a second array of via holes and a third die comprising a third array of light detecting units for detecting light from the first array of light emitting units is provided. The second layer is an interposer layer and is arranged between the first die and the third die. The first, second and third array are aligned such that light emitted from the first array of light emitting units passes through the second array of via holes and is detected by the third array of light detecting units. The first array of light emitting units and/or the third array of light detecting units are manufactured based on standard semiconductor manufacturing processes. Hence, the light emitting units and the light detecting units can be provided in a great number and at very small dimensions. Furthermore, the fabrication thereof can be easily integrated into the dies.

Throughout the description and claims the broad term "light emitting unit" will be referenced by the abbreviation (OLED). Thus the abreviation or reference OLED refers to light emitting units, such as LED's, OLED, etc.

According to an aspect of the invention, the second layer is implemented as an interposer die, as a printed circuit board, as plastic foil, metal foil, organic material and/or ceramic material.

According to a further aspect of the invention, the first array of light emitting units is controlled by parallel pulse switching.

According to still a further aspect of the invention, the electronic device is implemented as a system-in-package device.

According to a further aspect of the invention, the light emitting units are implemented as organic light emitting diodes integrated on the first die. The provision of organic light emitting diodes as light emitting units is advantageous as these organic light emitting diodes only require a low operating voltage.

According to a further aspect of the invention, the third die comprises a fourth area of light emitting units for emitting light and the first die comprises a fifth array of light detecting units for detecting lights from the fourth area of light emitting units. Hence, a bi-directional communication is possible between the first and third die.

According to still a further aspect of the invention, the at least one light emitting unit is tuned to emit light at a specific wavelength and wherein one of the light detecting units is tuned to the specific wavelength to receive the light only from the at least one light emitting unit.

The invention also relates to a method for manufacturing an electronic device. A first die is manufactured by depositing and patterning a first array of light emitting units. A second layer is manufactured on top of the first die by etching a second array of via holes into the second layer. A third die is manufactured by depositing and patterning a third array of light detecting units. The first, second and third array are aligned such that light emitted by the first array of light emitting units passes through the second array of via holes and is received by the third array of light detecting units.

The invention relates to the idea to provide a solution for an interconnect between several layers in an electronic device in the optical domain by providing via holes in an interposer layer. The chosen solution can be integrated into a standard semiconductor manufacturing process. The via holes can remain empty or can be filled with an optical medium with a correct refractive index. The electronic device may comprise three different dies, wherein the first die comprises an array of light emitting devices. The second die placed on top of the first die comprises a plurality or an array of via holes. On top of the second die a third die with an array of light detecting units or photo-detectors is provided. The photo-detectors are able to receive the light emitted by the light emitting diodes which have passed through the via holes in the second die. The second die can be implemented as an interposer. The via holes can have 0.1 to 1000 μm in diameter. Typically they are etched through the silicon substrate which can have a thickness of 5-1500 μm.

By means of the above described three dies a parallel processing of pulsed light can be implemented. Accordingly, a cost effective alternative to copper filled through wafer via holes can be provided.

Further aspects of the invention will be described in the dependent claims.

BRIEF DESCRIPTION OF THE DRAWINGS

Embodiments and advantages of the present application will be described in more detail with reference to the Figures.

DETAILED DESCRIPTION OF EMBODIMENTS

Figure 1:
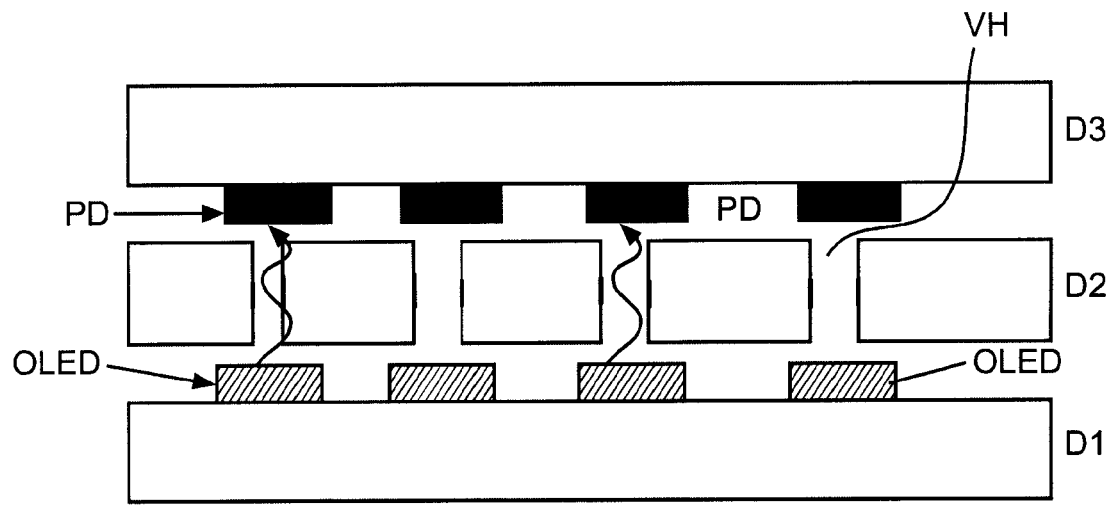
FIG. 1 shows a basic cross-section of an electronic device according to a first embodiment.

FIG. 1 shows a cross-section of an electronic device according to a first embodiment. The electronic device can be implemented as a system-in-package device. The device may comprise a first die D1 on which a plurality of light emitting devices or units OLED are provided. The light emitting devices can be arranged as a first array. On top or over the first die D1 a second layer D2 is provided which comprises a second array of via holes. The second layer may comprise a semiconductor die, a printed circuit board, plastic foil, (isolated) metal foil, organic material and/or ceramic material. Preferably, the second array of via holes are arranged such that the via holes are provided on top of or over the first array of light emitting devices when the second layer D2 is placed on top of and is aligned with the first die D1. On top of or over the second layer D2 a third die D3 is provided. The third die D3 may comprise a third array of light detecting units or photo detectors PD. Preferably, the third array of the light detecting units or photo detectors are arranged such that they are placed over and are aligned with the second array of via holes VH. Accordingly, light emitted by the light emitting devices OLED may pass through the via holes and may be detected by the photo detectors PD. The first array of light emitting units and/or the third array of light detecting units are manufactured based on standard semiconductor manufacturing processes.

The light emitting devices may be implemented as organic light emitting devices OLED or other high frequency or ultra high frequency light emitting devices or units. The light emitting units or devices are preferably organic light emitting devices OLED according to the first embodiment, as organic light emitting devices can be easily integrated into the semiconductor manufacturing process. Therefore, these organic light emitting devices can be fabricated in great number and with very small dimensions. However, it should be noted that also other light emitting devices can be used if these light emitting devices can be easily integrated into the semiconductor manufacturing process for the system-in-package device. The second layer D2 is used as an interposer die. The via holes may be 0.1-1000 μm in diameter. The via holes can be etched, laser drilled or mechanically drilled into a silicon die, which can have a thickness of 5-1500 μm. If a printed circuit board PCB is used as an interposer layer its thickness can amount up to 1 cm. The array of via holes can be etched, laser drilled and/or mechanically drilled into the second layer. The array of via holes are arranged to allow the light emitted by the light emitting devices on the first die to pass through the second layer.

The light detecting units or photodetectors PD on the third die D3 may for example be implemented as photo diodes, transistor lasers, bipolar light emitting transistors or other transistors which can detect light.

By means of the system-in-package device according to the first embodiment a parallel processing of pulsed light can be enabled. For example a high-speed optical communication at rates up to 100 Tbit/s can be achieved.

The system-in-package device can for example be used instead of 2D-based printed circuit board designs to avoid dissimilar delays in a high frequency (30 Gb/s) signal transport between a CPU and graphics or memory units on the printed circuit board.

In the following, the manufacturing of the system-in-package device according to the first embodiment is described. The first die D1 which corresponds to a bottom wafer can be manufactured as known in the prior art. The bottom wafer D1 may comprise several functional processors or control units or dies for controlling the light emitting devices on the first die. Thereafter, the layers required for the light emitting devices are deposited and patterned as known in the prior art. Preferably, the organic light emitting devices OLED are top-emission devices with a thin packaging for moisture protection. Finally, a protecting layer can be provided on top. The protecting layer may comprise the required contact openings for grounding.

Optionally, the light emitting devices can be covered with a paste printed transparent layer which can be used to implement optical lenses. The optical lenses can be used to direct the light beams into the corresponding via holes VH in the second layer D2, (second die or printed circuit board PCB).

The second layer D2 can be implemented as a silicon interposer wafer with an array of holes. The array of holes can be etched into the silicon substrate. The etching can be performed by RIE or by wet chemical etching. Alternatively, the holes can be provided by lasering a pattern of through-wafer via holes in the second layer D2. Thereafter the holes can be filled with a required refractive index. This material can for example be spin-on glass SOG or a polymer for example PMMA. The optional filling of the via holes is advantageous with respect to a subsequent processing of the second layer. The subsequent processing may include a layer deposition, photolithography and a subsequent patterning to implement active or passive circuits on the second die. Thereafter a capping of a layer deposition over through-holes (through-wafer or through-layer holes) can be performed to protect the interposer wafer. As mentioned above, the second die is used to provide the via holes VH through which the light emitted from the light emitting devices can pass through.

Alternatively, the interposer containing via holes can also be implemented as PCB. In that case the PCB is likely much larger than the silicon dies. Thus multiple die set can be implemented on one PCB interposer.

The third die D3 with the photo-detectors can be processed according to the known and standard technology.

It should be noted, that the three dies (or two dies sandwiching a printed circuit board PCB interposer) can be manufactured based on complete different technologies and be integrated into a system-in-package device.

The above described light emitting devices and light detecting units or photo-detectors can be manufactured based on standard semiconductor manufacturing processes.

Figure 2:
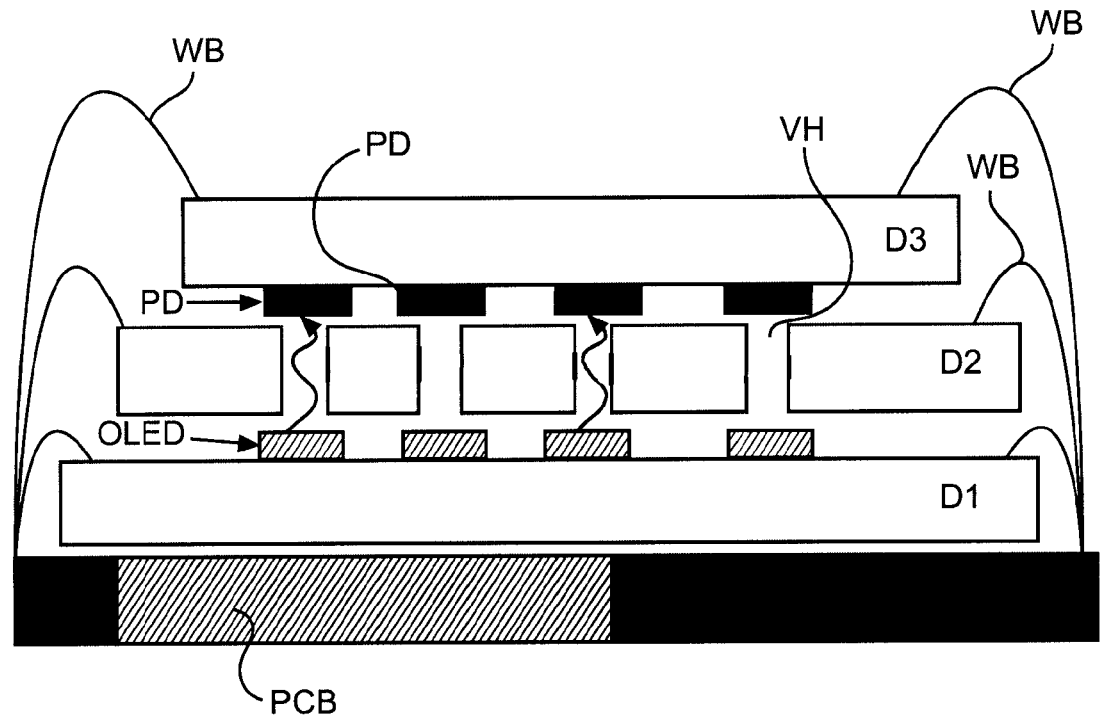
FIG. 2 shows a basic cross-section of an electronic device according to the second embodiment.

FIG. 2 shows a cross-section of an electronic device according to a second embodiment. The electronic device according to the second embodiment can be based on the electronic device according to the first embodiment. Accordingly, the electronic device according to the second embodiment can be implemented as a system-in-package device. The three dies D1-D3 according to the second embodiment are placed on a printed circuit board PCB and may correspond to the three dies D1-D3 according to the first embodiment. In addition, wire bonds WB are provided for coupling the printed circuit board PCB with each of the dies D1-D3. Accordingly, the electronic device according to the second embodiment provides a system-in-package device which has been assembled from the three dies D1-D3 and where a wafer bonding has been performed. Furthermore, a die singulation can be performed by standard technology. In addition, the required grounding of the dies can be accomplished by known prior art methods.

It should be noted that the system-in-package device according to the first and second embodiment enables a low-power operation. Due to the fact that the light emitted from the light emitting devices is directly received by the photo-detectors PD the signal transport is reduced, less clock cycles are required such that the internal speed can be reduced without sacrificing a very fast operation speed.

Preferably, the light emitting devices are implemented as organic light emitting diodes. These organic light emitting devices require less power to generate a detectable amount of light.

The specific arrangement of the via holes VH in the second die D2 over or on top of the light emitting devices in the first die D1 will lead to a collimation of light such that the photo detectors PD can efficiently adsorb the received light. Furthermore, cross-talk between the light emitting devices can be reduced.

Figure 3:
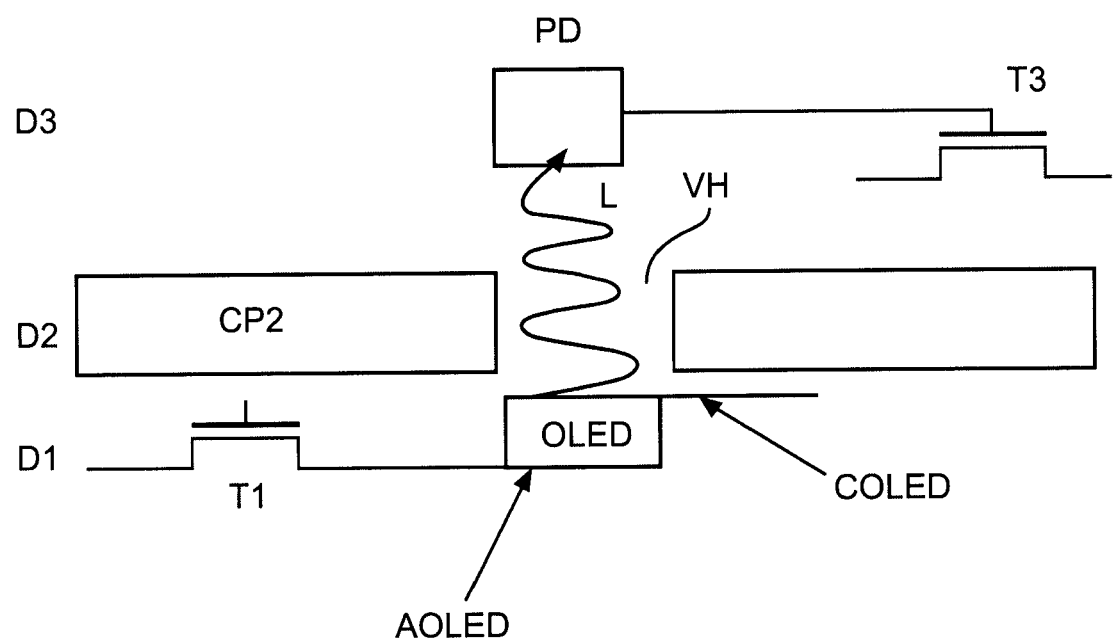
FIG. 3 shows a basic scene of an electronic device according to a third embodiment.

FIG. 3 shows a basic representation of an electronic device according to the third embodiment. Here, the third embodiment is based on the first or second embodiment. Accordingly, three dies D1-D3 are provided. On the first die D1 a transistor T1 is coupled to the anode of the light emitting device OLED (AOLED). On top of or over the first die D1 a second layer D2 with a channel plate CP2 with via holes VH is provided. On top of or over the second layer D2 a third die D3 with a transistor T3 and a photo detector PD is provided. The light from the light emitting device OLED passes through the via hole VH and is detected by the photo-detector PD. The transistor T1 in the first die D1 and the transistor T3 in the third die D3 can be implemented as CMOS transistors.

According to a fourth embodiment which can be based on the first, second or third embodiment the light emitting devices can be implemented based on bipolar light emitting transistors as described in Klootwijk et al., "Photo Carrier Generation in Bipolar Transistors", IEEE Trans. Electron Devices, 49(9), 2002, page 1628.

According to a fifth embodiment which can be based on the first, second, third or fourth embodiment, grounding of the second die (interposer die) by means of Cu-paste grounding of a few selected via holes in the interposer die can be performed instead of a wire bonding. The conductivity of modern pastes is approximately 30 $\mu\Omega\cdot$cm. This is in particular advantageous as the full wafers can be aligned and bonded before the die singulation and packaging.

According to a sixth embodiment which can be based on the first, second, third, fourth or fifth embodiment, the second layer D2 can be implemented as a printed circuit board. The via holes can have 0.1 to 1000 µm in diameter. Typically they are manufactured (etched, laser drilled, etc.) through the interposer (silicon, PCB, etc.) substrate which can have a thickness of 5 up to 1500 µm.

The above described light detecting units can be photo detectors, transistors able to detect light and/or standard-processed component like diodes, transistors, etc.

According to a further embodiment the first and third die (top and bottom) may each contain light emitting sources as well as light emitting detectors to enable a two-way communication.

According to a further embodiment the interposer die D2 may contain a counter bump structure. Here, the third die D3 can be bumped on the second layer D2 and the interposer layer D2 can be electrically connected by means of wire bonding.

According to a further embodiment of the invention, part of the via holes can be used to trigger or synchronize clock signals.

According to a further embodiment of the invention, the clock signals of an electronic device are distributed by means of the above described die stacks. In other words, by means of the above described die stack, the synchronization of the electronic device can be implemented to ensure a very high operational frequency. The above described die stacks can also be used to synchronize the chips or electronic device locally in a redistributed manner. Accordingly, by means of these distributed clock signals, several functional islands in the electronic device can be implemented, wherein the functional islands are clocked individually but are synchronized. This can for example be implemented in ultra-wideband communication units.

If organic light emitting devices OLED are used as light emitting units in the above described die stack, the electronic device can be a low power electronic device as the OLED can be operated for example at a low voltage of 1.8 V. Furthermore, the OLED can be implemented with a low current requirements such that they are able to implement a low power device.

The above described system-in-package device can comprise one or more die stacks. Each of those stacks does not necessarily consist out of 3 dies.

The above described organic light emitting devices OLED can be tuned to emit different wavelengths. Therefore, neighboring OLED can be tuned to different wavelengths such that neighboring OLED do not interfere with each other. The corresponding light detecting units in the third die must then also be tuned to the corresponding wavelength. Hence, stray lights from any of the OLED does not interfere with the detection of the light detecting units. In such a way, a wavelength discrimination between the sender and the receiver can be performed. This is in particular advantageous with respect to the signal-to-noise ratio SNR.

The system-in-package device according to the above-described embodiments can be used in several applications for providing high speed data or high speed signal transport. Therefore, such system-in-package devices can be used in RF modules including (ultra)wide band wireless communication, TV-on-Mobile devices, video processing, supercomputers, car radar, etc.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be constrained as limiting the scope of the claims.

The invention claimed is:

1. Electronic device, comprising:
at least one die stack having a first die (D1) comprising a first array of light emitting units for emitting light; a second layer (D2) comprising a second array of via holes (VH); and a third die (D3) comprising a third array of light detecting units (PD) for detecting light from the first array of light emitting units;
wherein the second layer (D2) is an interposer layer and is arranged between the first die (D1) and the third die (D3);
wherein the first, second and third array are aligned such that light emitted by the first array of light emitting units passes through the second array of via holes (VH) and is detected by the third array of light detecting units (PD),
wherein the first array of light emitting units comprise layers deposited and patterned onto the first die (D1), and
wherein the first die (D1), the second layer (D2), and the third die (D3) are bonded one to the other.

2. Electronic device according to claim 1, wherein the second layer (D2) is implemented as an interposer die, as a printed circuit board, plastic foil, metal foil, organic material and/or ceramic material.

3. Electronic device according to claim 1, wherein the first array of light emitting units are controlled by parallel pulsed switching.

4. Electronic device according to claim 1, wherein the electronic device is implemented as a System-in-Package device.

5. Electronic device according to claim 1, wherein the light emitting units are implemented as organic light emitting diodes or as a bipolar light emitting transistors.

6. Electronic device according to claim 1, wherein clock signals are distributed on the electronic device by means of the first array of light emitting units and the third array detecting units (PD).

7. Electronic device according to claim 1, wherein the light emitting units are implemented as top emission devices with a moisture protection packaging.

8. Electronic device according to claim 1, wherein the third die (D3) comprises a fourth array of light emitting units for emitting light; and the first die (D1) comprises a fifth array of light detecting units (PD) for detecting light from the fourth array of light emitting units.

9. Electronic device according to claim 5, wherein at least one of the light emitting units is tuned to emit light at a specific wavelength,
wherein at least one of the light detecting units (PD) is tuned to the specific wavelength to receive the light only from the at least one light emitting unit.

10. Wide band communication device comprising at least an electronic device according to claim 1.

11. Processing device comprising at least an electronic device according to claim 1.

12. Electronic device according to claim 1, further comprising a plurality of first die (D1).

13. Electronic device according to claim 1, further comprising a plurality of second layers (D2).

14. Electronic device according to claim 1, further comprising a plurality of third die (D3).

15. A stacked die comprising:
a first die having a plurality of light emitting units patterned into layers of the first die;
a second die having a plurality of light detecting units; and
an intermediate layer having a plurality of vias, wherein the intermediate layer is interposed between the first die and the second die,
wherein the plurality of light emitting units and the plurality of vias and the plurality of light detecting units are aligned such that light emitted by the plurality of light emitting units passes through the plurality of vias and is detected by the plurality of light detecting units, and
wherein the first die, the second die, and the intermediate layer are bonded one to the other by a wafer process.

16. The stacked die of claim 15, wherein the intermediate layer is a die.

17. The stacked die of claim 15, wherein the intermediate layer is a silicon wafer.

18. The stacked die of claim 15, wherein the intermediate layer is a printed circuit board.

19. The stacked die of claim 15, wherein the first die does not include a light detecting unit, and
wherein the third die does not include a light emitting unit.

20. The stacked die of claim 15, wherein the first die includes a control unit configured to control the plurality of light emitting units on the first die.

* * * * *